(12) United States Patent
Huang et al.

(10) Patent No.: US 6,594,061 B2
(45) Date of Patent: Jul. 15, 2003

(54) ACCELERATION-INSENSITIVE OPTO-ELECTRONIC OSCILLATORS

(75) Inventors: Shouhua Huang, Arcadia, CA (US); Meirong Tu, Chino Hills, CA (US); X. Steve Yao, Diamond Bar, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 09/879,795

(22) Filed: Jun. 11, 2001

(65) Prior Publication Data

US 2002/0106142 A1 Aug. 8, 2002

Related U.S. Application Data

(60) Provisional application No. 60/210,376, filed on Jun. 9, 2000.

(51) Int. Cl.⁷ .................................. G02F 1/01

(52) U.S. Cl. .................. 359/239; 359/245; 359/276; 359/279

(58) Field of Search .................. 359/239, 245, 359/276, 279; 385/1–3, 27–29, 136, 137

(56) References Cited

U.S. PATENT DOCUMENTS

| | | | | |
|---|---|---|---|---|
| 5,212,711 A | * | 5/1993 | Harvey et al. | 372/94 |
| 5,574,807 A | | 11/1996 | Snitzer | 385/24 |
| 5,917,179 A | * | 6/1999 | Yao | 250/227.11 |
| 5,999,304 A | * | 12/1999 | Sanders et al. | 359/237 |

* cited by examiner

Primary Examiner—Georgia Epps
Assistant Examiner—M. Hasan
(74) Attorney, Agent, or Firm—Fish & Richardson P.C.

(57) ABSTRACT

Techniques for reducing frequency shifts in an oscillating frequency of an opto-electronic oscillator by having at least two separate optical delay elements in an optical portion of an opto-electronic feedback loop.

23 Claims, 6 Drawing Sheets

ACCELERATION-INSENSITIVE OPTO-ELECTRONIC OSCILLATORS

This application claims the benefit of U.S. Provisional Application No. 60/210,376 filed on Jun. 9, 2000.

ORIGIN OF THE INVENTION

The systems and techniques described herein were made in the performance of work under a NASA contract, and are subject to the provisions of Public Law 96-517 (35 USC 202) in which the Contractor has elected to retain title.

BACKGROUND

This application relates to generation of oscillating signals by using opto-electronic oscillators.

Oscillating signals may be generated by using various types of oscillators having energy storage elements. The quality factor Q, or the energy storage time, of an energy storage element can determine the spectral linewidth of the respective oscillating signal. High quality factor Q or long energy storage time can be used to reduce the spectral linewidth of the oscillating signal and hence improve the signal spectral purity.

Spectrally pure oscillators in radio frequency (RF), microwave, and millimeter wave spectral ranges may be used for generating, tracking, cleaning, amplifying, distributing signal carriers, and other applications. Such signal carriers can be applied in communication, broadcasting, radar, measurements, and receiving systems in the radio frequency spectral range. Voltage-controlled RF oscillators with phase-locked loops can be used for, e.g., clock recovery, carrier recovery, signal modulation and demodulation, and frequency synthesizing.

The above signal oscillators can be constructed by opto-electronic oscillators ("OEOs") having both electronic and optical components. See, e.g., U.S. Pat. Nos. 5,723,856 to Yao and Maleki and 5,777,778 to Yao. Such an OEO includes an electrically controllable optical modulator and at least one active opto-electronic feedback loop that comprises an optical part and an electrical part interconnected by an optical-to-electronic conversion unit such as a photodetector. The opto-electronic feedback loop receives the modulated optical output from the modulator and converts it into an electrical signal to control the modulator. The feedback loop produces a desired delay and feeds the electrical signal in phase to the modulator to generate and sustain both optical modulation and electrical oscillation in radio frequency spectrum when the total loop gain of the active opto-electronic loop and any other additional feedback loops exceeds the total loss.

OEOs use optical modulation to produce oscillations in frequency spectral ranges that are outside the optical spectrum, such as in RF and microwave frequencies. The generated oscillating signals are tunable in frequencies and can have narrow spectral linewidths and low phase noise in comparison with the signals produced by other RF and microwaves oscillators. Notably, the OEOs are optical and electronic hybrid devices. In particular, an OEO-generated oscillating signal can be carried by an optical carrier signal. Hence, OEOs can be used in optical communication devices and systems for various applications beyond the traditional use of the electronic RF oscillators.

A variety of OEOs can be constructed to achieve certain operating characteristics and advantages. For example, Coupled opto-electronic oscillators ("COEOs") described in U.S. Pat. No. 5,929,430 to Yao and Maleki can directly couple a laser oscillation in an optical feedback loop to an oscillation in an opto-electronic feedback loop. Opto-electronic oscillators can also be implemented by having a Brillouin optical medium in the optical portion of at least one active opto-electronic feedback loop to generate an electrical modulation signal based on the stimulated Brillouin scattering. U.S. Pat. No. 5,917,179 to Yao. Such a Brillouin OEO can use the natural narrow linewidth of the Brillouin scattering to select a single oscillating mode. Furthermore, the optical portion of each opto-electronic feedback loop may include an optical resonator to produce the desired delay. See, e.g., U.S. application Ser. No. 09/491,988 by Yao et. al. filed Jan. 26, 2000.

SUMMARY

The present disclosure includes opto-electronic oscillators that implements a mechanism in the optical portion of an opto-electronic feedback loop to reduce effects on operation of the OEOs caused by an acceleration of the OEOs in motion.

DETAILED DESCRIPTION

Opto-electronic oscillators may be carried in moving objects, such as motorized vehicles, ships, aircraft, and spacecraft (e.g., satellites and space shuttles). Hence, such an OEO may need to operate properly when it is subject to acceleration of the moving object in which it is located. One kinetic effect of the acceleration of the moving object is to exert a force associated with the acceleration on the OEO. This force may cause deformation on the optical portion of an opto-electronic feedback loop of the OEO.

The deformation, in turn, can cause a change in the effective refractive index, the physical dimension, or both, of the optical portion of the opto-electronic feedback loop and consequently change the total optical path length. Because the oscillating frequency of an oscillating mode in the feedback loop is a function of the total delay of the feedback loop, the above acceleration-induced change in the total optical path length can cause a frequency shift in the oscillating frequency of the oscillating mode of the OEO. This frequency shift is generally undesirable and contributes to noise in the output of the OEO for applications where the OEO oscillating frequency is desired to be stable at a selected frequency.

In recognition of the above, the present disclosure provides, in one aspect, techniques for reducing the acceleration-induced shift in the oscillating frequency of an OEO. The optical portion of the opto-electronic feedback loop may be partitioned into two parts as first and second optical delay elements that are optically connected to each other. Hence, the total optical delay of the opto-electronic loop is essentially the sum of a first optical delay produced by the first optical delay element and a second optical delay produced by the second optical delay element. The two optical delay elements are mounted and engaged to the moving object that carries the OEO in a way that the acceleration-induced frequency shift in the first optical delay element is opposite in the direction of the frequency shift with respect to the acceleration-induced frequency shift in the second optical delay element. Therefore, under this configuration, the frequency shifts in the two optical delay elements negate each other so that the net acceleration-induced frequency shift is small and may be substantially reduced below a tolerance level. In principle, when the acceleration-induced frequency shifts of the two optical delay elements are substantially equal in magnitude, the net acceleration-induced frequency shift may be completely eliminated under ideal operating conditions.

In general, the optical portion of the opto-electronic feedback loop may be partitioned into more than two connected optical delay elements. The optical delay elements are mounted so that the acceleration-induced frequency shifts in some of the optical delay elements are opposite to those in other optical delay elements to reduce the net frequency shift.

Figure 1:
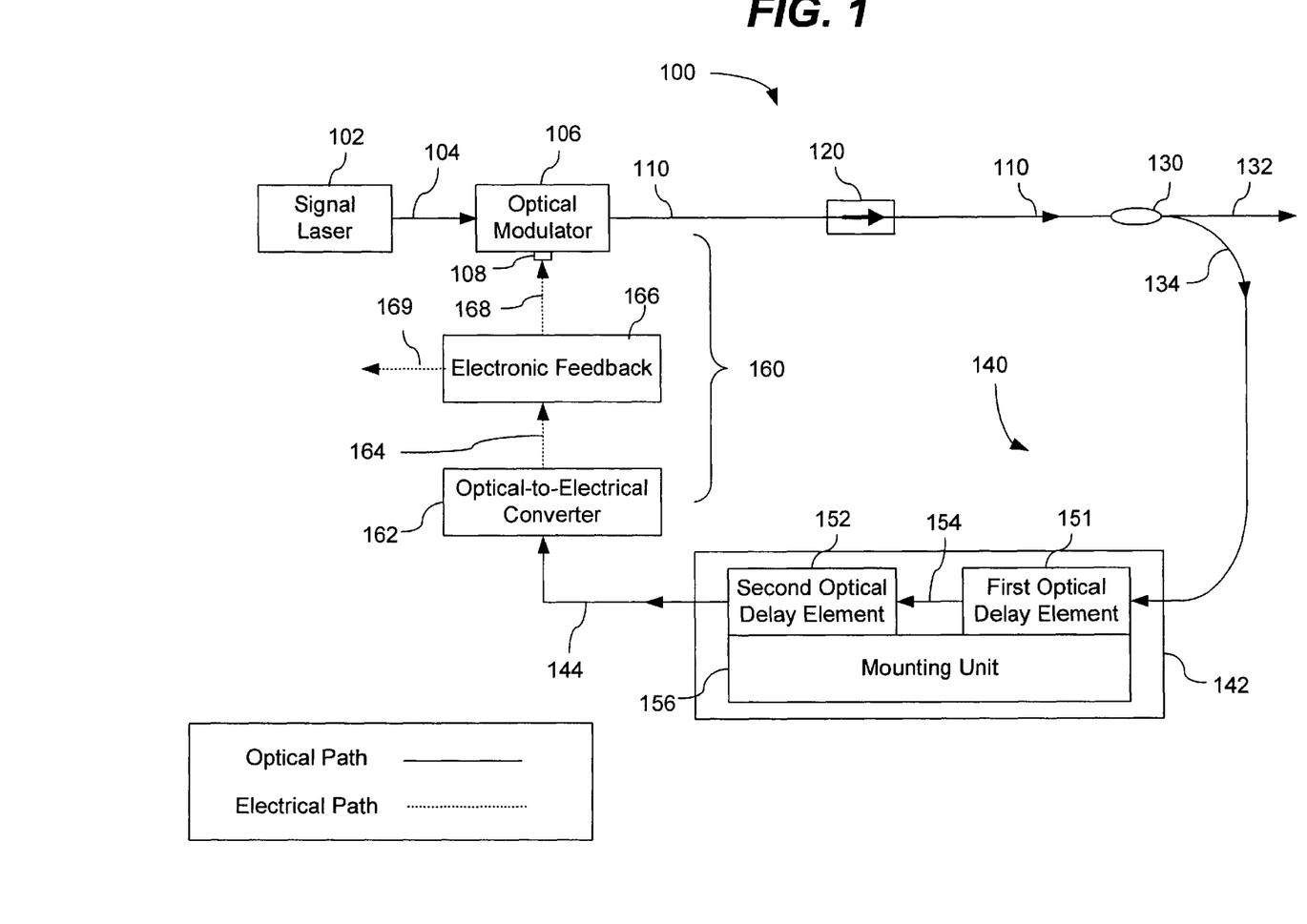
FIG. 1 shows one embodiment of an acceleration-insensitive OEO where two optical delay elements are implemented to produce acceleration sensitivities with opposite signs.

FIG. 1 shows one embodiment of an OEO 100 that an optical portion 140 of its opto-electronic loop has two optical delay elements 151 and 152 optically coupled in series for reducing the acceleration-induced frequency shift. A light source 102, e.g., a signal laser, is provided to produce a signal beam 104 at a selected signal wavelength. An electro-optic ("EO") modulator 106 is positioned to receive the signal beam 104 and is designed to modulate the beam 104 in response to an electrical control signal 168 applied to an electrical port 108. This process produces a modulated output beam 110. An optical splitter 130, such as a beam splitter or a fiber coupler, is used to split a portion of the modulated beam 110 to produce an optical feedback beam 134 and outputs the remaining portion as an optical output 132. An opto-electronic feedback loop, having an optical portion 140 and an electrical portion 160, is coupled to receive the optical feedback beam 134 and operates to produce the control signal 168 based on the optical feedback beam 134.

The optical modulator 106 may be a phase modulator or an amplitude modulator. An optional optical isolator 120 may be disposed in the output of the modulator 106 to remove any adverse optical feedback to the modulator 106. The light modulation is controlled by the feedback signal 168 at the driving port 108. The opto-electronic feedback loop and the EO modulator 106 form a closed loop to support opto-electronic oscillation when the total gain in the opto-electronic loop and the optical modulator 106 is maintained above the total loss. The loop gain can be controlled and maintained by using electrical amplifier in the electrical part 160, injecting electrical or optical power, optical amplification in the optical part 140, or a combination of the above. In addition, the feedback from the opto-electronic feedback loop to the modulator 106 is positive, or in phase, in order to produce an oscillation. This can be achieved by controlling the total delay or phase shift of the feedback loop. Depending on the total delay of the opto-electronic loop, the oscillation can be achieved at desired frequencies such as in the RF microwave spectral ranges. A loop control element may be coupled at a selected location in the opto-electronic loop to control the total loop delay so that the oscillating frequency is tunable. This element may be implemented as a variable RF delay element in the electrical part 160 or a variable optical delay element in the optical part 140.

The electrical part 160 of the opto-electronic feedback loop includes an electronic feedback circuit 166 which may include an electrical amplifier and an electrical signal band-pass filter to select a desired spectral component as the feedback driving signal 168 to the port 108 of the modulator 106. The band-pass filter may be used to achieve a single mode oscillation by suppressing other oscillation modes. The circuit 166 may also include an electrical coupler to produce an output electrical signal 169 that includes information of the opto-electronic oscillation. Notably, both electrical signal and the optical signal in the oscillator 100 are in the opto-electronic feedback loop and hence are inherently interconnected. If either signal changes, the other also changes accordingly.

The optical part 140 of the opto-electronic loop includes an optical delay element 142 whose delay dominates the optical delay of the optical part 140. The feedback optical beam 134 is sent into the optical delay element 142 to produce a delayed optical signal 144 to be converted by the converter 162. In general, the optical delay element 142 may include a section of fiber (e.g., of a length about kilo meters) or an optical resonator. To reduce the frequency shift due to acceleration of the OEO when placed in a moving object, the optical delay element 142 in this embodiment is partitioned into the first optical delay element 151 and the second optical delay element 152. Hence, the first optical delay element produces a first delay on the signal 134 to produce a delayed signal 154. The second optical delay element 152 receives the delayed signal 154 from the first optical delay element 151 and produces additional delay thereon to generate the signal 144.

A mounting unit 156 is used to engage the optical delay elements 151 and 152 so that two optical delay elements, although experiencing the same acceleration of the moving OEO 100, produce acceleration-induced frequency shifts with opposite signs, i.e., one up-shifting the oscillating frequency while the other down-shifting the oscillating frequency. When the two optical delay elements 151 and 152 are properly designed, e.g., having approximately the same optical delay in the stationary state and producing the approximately the same amount but opposite frequency shift under acceleration, the net acceleration-induced frequency shift can be substantially reduced below a tolerance level.

Figure 2:
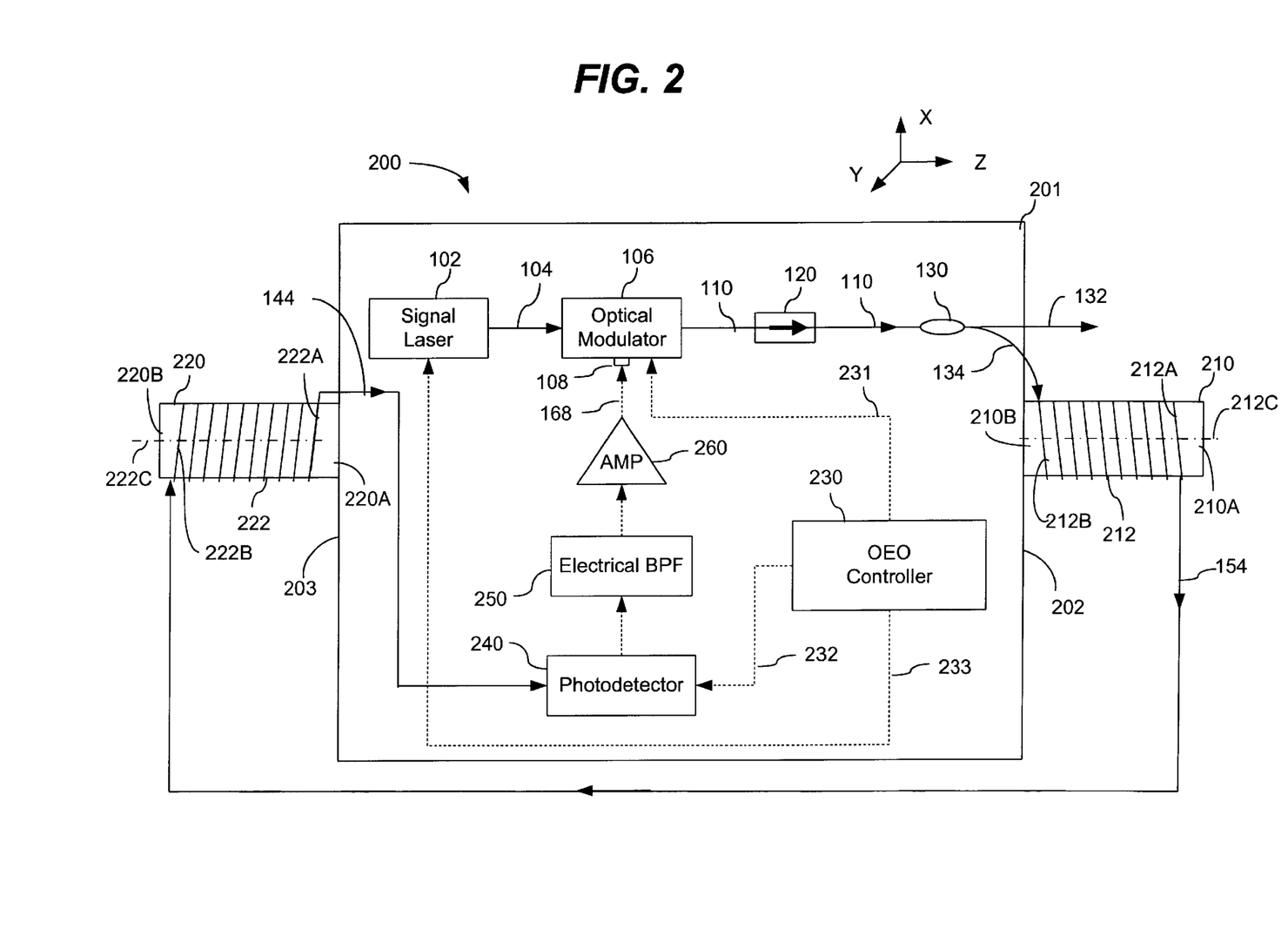
FIG. 2 shows a fiber-based OEO using the design in FIG. 1.

FIG. 2 shows an exemplary OEO 200 based on the embodiment in FIG. 1. The electrical portion of the opto-electronic loop includes a photodetector 240, an electrical band-pass filter 250, and an electrical signal amplifier 260. An OEO controller 230 is provided to control the operation of the OEO 200. For example, the OEO controller 230 may be coupled to the optical modulator 106, the photodetector 240, and the signal laser 102 to control their operations via control signals 231, 232, and 233, respectively.

Notably, the optical portion of the opto-electronic loop includes two substantially identical and optically connected fiber coils 212 and 222 as the optical delay elements. The length of the fiber in the coil 212 is substantially equal to that in the coil 222. The fiber coils 212 and 222 are supported by two elongated members 210 and 220, respectively. Each elongated member 210 or 220 has two opposing terminals 210A and 210B or 220A and 220B and may be implemented by a cylindrical spool. The fiber is wound around the respective elongated member from the terminal 210B or 220B to terminal 210A or 220A to form the respective fiber coil 212 or 222. The feedback optical beam 134 is fed into the fiber coil 212 on the member 210 from the terminal 210B and exits as the signal 154 at the terminal 210A. Accordingly, the signal 154 is fed into the fiber coil 222 on the member 220 from the terminal 220B and exits as the signal 144 at the terminal 220A for conversion by the detector 240.

In this implementation, the two fiber coils 212 and 222 are engaged in a special way in the OEO 200 to achieve the desired opposite acceleration-induced frequency shifts. As illustrated, the OEO 200 has a housing fixture 201 which is used as the mounting unit 156 in FIG. 1. All OEO components are attached and fixed to the housing fixture 201. The fiber coil 212 is engaged to the housing fixture 201 by fixing the terminal 210B of the spool 210 to the one surface 202 of the housing fixture 201. Fixed to another surface 203 that faces the opposite direction of the surface 202, is the fiber coil 222 by attaching its terminal 220A to the surface 203. In this arrangement, the symmetrical axes 212C and 222C of the fiber coils 212 and 222, respectively, are substantially parallel to each other along a common z direction.

In the context of kinetics, the fiber turn 212B in the coil 212 closest to the terminal 210B and the fiber turn 222A in the coil 222 closest to the terminal 220A experience opposite acceleration-induced forces when the OEO 200 accelerates or decelerates along the z direction. The fiber turn 212A in the coil 212 closest to the terminal 210A and the fiber turn 222B in the coil 222 closest to the terminal 220B have a similar kinetic relationship with each other. It can be shown that, this arrangement produces opposite frequency shifts in the two fiber coils. Similarly, opposite frequency shifts can be achieved when the feedback signal 134 is coupled into the fiber turn 222A of the coil 222, the signal 154 is fed from the fiber turn 222B to the fiber turn 212B of the coil 212, and the signal 144 is fed from the fiber turn 212A to the photodetector 240.

Figure 3:
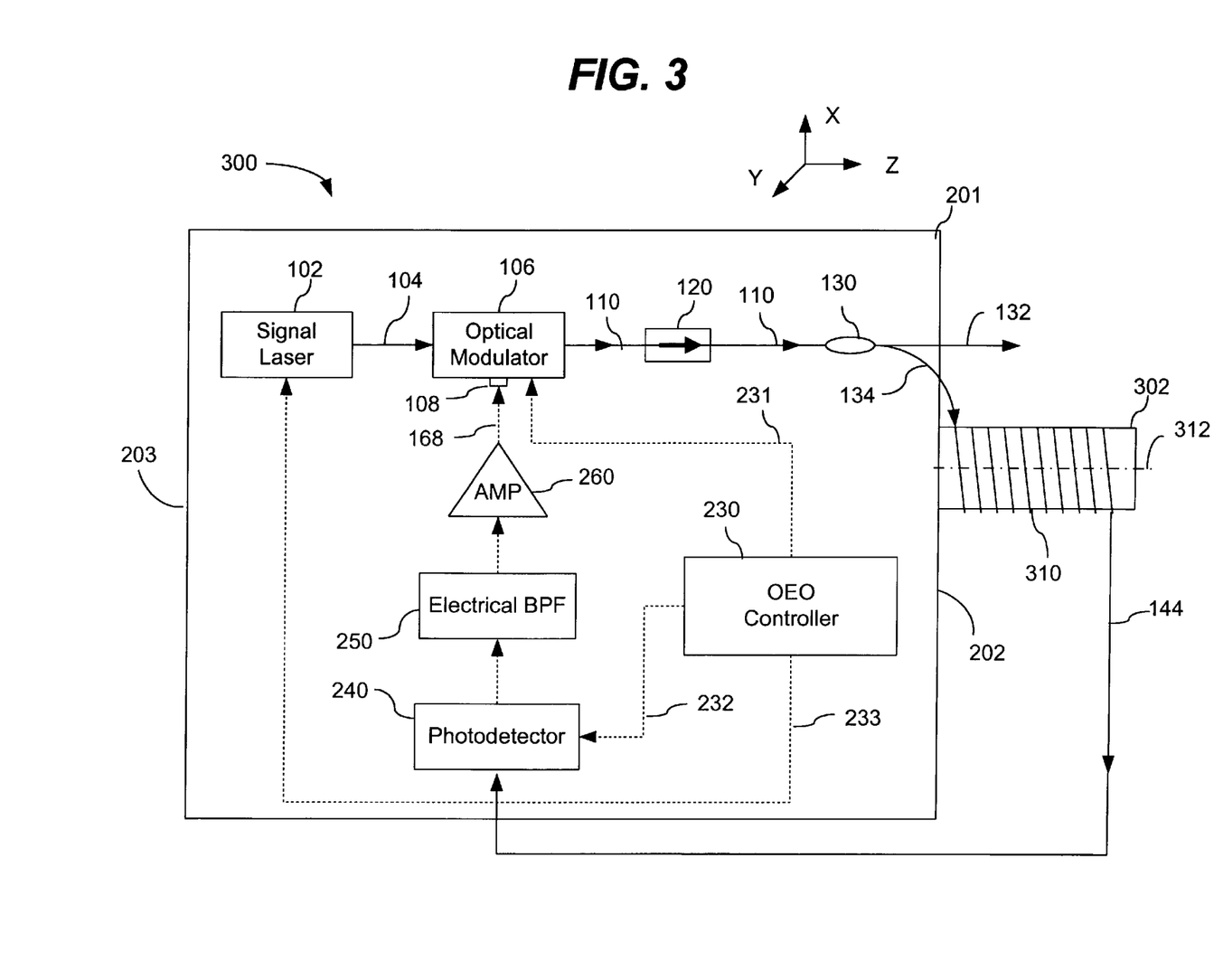
FIG. 3 shows a fiber-based OEO without the acceleration sensitivity compensation shown in FIG. 1.

In comparison, FIG. 3 illustrates an OEO 300 with an arrangement in which the a single fiber coils 310 formed on a spool 302 with a coil axis 312C is used. The fiber length in the single coil 310 is the sum of the fiber lengths of the two fiber coils 212 and 222 in OEO 200 so that the total delay caused by the single fiber coil 310 is about the same as the two fiber coils 212 and 222. However, this single fiber coil design does not produce opposite frequency shifts when the OEO accelerates or decelerates along the z direction. As a result, the OEO 300 is sensitive to the acceleration.

The following sections provide a simplified analysis to explain the reduction of the acceleration sensitivity of the OEO 200 shown in FIG. 2. Assuming the oscillating frequency of the OEO 200 in a stationary station or a motion at a constant velocity is $f_o$, then the actual oscillating frequency under an acceleration vector $\vec{a}$ can be expressed as:

$$f(\vec{a}) = f_o(1+\vec{\Gamma}\cdot\vec{a})$$

where $\vec{\Gamma}$ is the acceleration sensitivity vector of the OEO. For an effective path length L of the OEO feedback loop with a change ΔL caused by the acceleration, the acceleration sensitivity can be related to ΔL by the following expression:

$$\vec{\Gamma}\cdot\vec{a} = \frac{\Delta f}{f_o} = -\frac{\Delta L}{L},$$

where $\Delta f = f(\vec{a}) - f_o$ is the frequency shift induced by the acceleration. It is further assumed that, the optical delay dominates the total delay caused by the OEO feedback loop.

Under this assumption, the following approximation may be made:

$$\frac{\Delta L}{L} = \frac{\Delta L_{optical} + \sum_i \Delta L_i}{L_{optical} + \sum_i L_i} \approx \frac{\Delta L_{optical}}{L_{optical}}$$

where $L_{optical}$ is the effective optical path length associated with the optical delay, $\Delta L_{optical}$ is the acceleration-induced change in the effective optical path length, and $L_i$ and $\Delta L_i$ are effective signal path lengths and their respective changes of other components (including, e.g., the electrical components) in the OEO feedback loop whose actual oscillating frequency is $$f(\vec{a}) = f_o\left[1+\sum_i \vec{\Gamma}_i \cdot \vec{a}\right].$$

It can seen that, an OEO with a single optical delay element is sensitive to the acceleration caused by $\Delta L_{optical}$.

When the optical delay is partitioned into two or more physically separate but optically connected delay elements, the acceleration sensitivity can be expressed by the following:

$$\vec{\Gamma}\cdot\vec{a} = -\frac{\Delta L}{L} \approx -\frac{\sum_i \Delta L_{optical}^i}{\sum_i L_{optical}^i}.$$

Therefore, when different optical delay elements have values in $\Delta L_{optical}^i$ with different signs, the sum may be substantially reduced or eliminated. In the above example of two optical delay elements (i=1 and 2), $\Delta L_{optical}^1 > 0$ while $\Delta L_{optical}^2 < 0$. If $\Delta L_{optical}^2 = -\Delta L_{optical}^2$, then the acceleration-induced frequency shift is eliminated.

As an illustration, the OEO 200 under a sinusoidal acceleration $\vec{a} = \vec{A}\cos(2\pi f_v t$ is considered in the following. The OEO's output frequency can be written as:

$$f(\vec{a}) = f_o\left[1+\sum_{i=1}^{2} \vec{\Gamma}_i \cdot \vec{A}\cos(2\pi f_v t + \phi_1)\right]$$

where φ1 and φ2 are the relative phase values of the two fiber coils 212 and 222. The phase difference $\Delta\phi = (\phi_1 - \phi_2)$ can be made sufficiently small to be negligible if the fiber coils 212 and 222 are mounted rigidly to the fixture 201 relative to each other. When two fiber coils 212 and 222 are connected in the manner as shown in FIG. 3, the acceleration sensitivity values of the two fiber coils 212 and 222 have the same sign and do not cancel. The symmetric coil arrangement in FIG. 2, however, produces the desired cancellation.

Assuming the two coils 212 and 222 are identical, the output of the OEO 200 is $$V(t) = V_o\cos[2\pi f_o t + \beta\cos(2\pi f_v t) - \alpha\sin(2\pi f_v t)],$$

$$= V_o\sum_{n=-\infty}^{+\infty}\sum_{m=-\infty}^{+\infty}(-1)^m J_n(\beta)\{J_{2m}(\alpha)\cos[2\pi(f_o+(2m+n))f_v]t + J_{2m+1}(\alpha)\sin[2\pi(f_o+(2m+n+1))f_v]t\},$$

where $$\beta = \frac{(\vec{\Gamma}_1 + \vec{\Gamma}_2 \cos\Delta\phi) \cdot \vec{A} f_o}{f_v} \text{ and}$$

$$\alpha = \frac{\vec{\Gamma}_2 \cdot \vec{A} f_o \sin\Delta\phi}{f_v}.$$

The fiber coils 212 and 222 can be carefully designed and mounted so that $$\vec{\Gamma}_1 + \vec{\Gamma}_2 \cos\Delta\phi = 0,$$

which is $\vec{\Gamma}_1 \approx -\vec{\Gamma}_2$ when $\Delta\phi \approx 0$. The residual acceleration sensitivity can be expressed as $$\Delta\vec{\Gamma} = \vec{\Gamma}_2 \sin\Delta\phi,$$

and the corresponding OEO output is $$V(t) = V_o J_o(\alpha)\cos(2\pi f_o t) + V_o \sum_{m=1}^{+\infty} (-1)^{m+1} J_{2m-1}(\alpha)\{\sin[2\pi(f_o + (2m-1)f_v)t] + \sin[2\pi(f_o - (2m-1)f_v)t]\} -$$

$$V_o \sum_{m=1}^{+\infty} (-1)^{m+1} J_{2m}(\alpha)\{\cos[2\pi(f_o + 2mf_v)t] + \cos[2\pi(f_o - 2mf_v)t]\}.$$

The acceleration of the OEO can cause modulation sidebands. The above equation can be used to compute the amplitudes of such sidebands.

TABLES I and II show measured acceleration sensitivities of one implementation system of the OEO 200 where two identical fiber coils made from Corning SFM-28 fiber with a length of 1 km. Each coil has a diameter of about 9.5 cm with a length of about 2.5 cm measured from the fiber turns 212A to 212B. The insertion loss of each coil is about 0.5 dB. The OEO was mounted to a vibration table for measurements. The oscillating frequency $f_o$ of the OEO without acceleration is 11.763 GHz and the vibration frequency is about 40 Hz for measurements in TABLE I and 60 Hz in TABLE II. The measured values are expressed in units of $10^{-10}/g$ where g is the gravitational constant. The total acceleration sensitivity is the square root of the sum of the squared sensitivities along x, y, and z directions. The averaged sensitivity is less than $1.5 \times 10^{-10}/g$ at an oscillating frequency of 11.763 GHz. In comparison, TABLE III shows the measurements obtained from the same fiber coils based on the coil arrangement in FIG. 3. The measurements show that, the acceleration sensitivity along the z direction is reduced by a factor about 40 by using the technique shown in FIG. 2.

TABLE I

| Number of Test | $\Gamma^x$ | $\Gamma^y$ | $\Gamma^z$ | $\Gamma^{total}$ |
|---|---|---|---|---|
| 1 | 0.713 | 0.650 | 0.970 | 1.368 |
| 2 | 0.465 | 0.900 | 1.140 | 1.525 |
| 3 | 0.453 | 1.124 | 0.460 | 1.296 |
| 4 | 0.584 | 0.982 | 0.820 | 1.406 |
| 5 | 0.556 | 0.485 | 0.740 | 1.045 |
| Average | 0.554 | 0.828 | 0.826 | 1.294 |

TABLE II

| Number of Test | $\Gamma^x$ | $\Gamma^y$ | $\Gamma^z$ | $\Gamma^{total}$ |
|---|---|---|---|---|
| 1 | 0.587 | 0.813 | 1.310 | 1.650 |
| 2 | 0.791 | 0.477 | 1.400 | 1.677 |
| 3 | 1.008 | 0.419 | 0.940 | 1.441 |
| 4 | 0.629 | 0.497 | 1.230 | 1.468 |
| 5 | 0.657 | 0.702 | 0.740 | 1.213 |
| Average | 0.734 | 0.582 | 1.124 | 1.463 |

TABLE III

| Number of Test | $\Gamma^x$ | $\Gamma^y$ | $\Gamma^z$ | $\Gamma^{total}$ |
|---|---|---|---|---|
| 1 | 0.713 | 0.650 | 32.259 | 32.273 |
| 2 | 0.465 | 0.900 | 32.146 | 32.162 |
| 3 | 0.453 | 1.124 | 30.870 | 30.894 |
| 4 | 0.584 | 0.982 | 31.484 | 31.505 |
| 5 | 0.556 | 0.485 | 33.886 | 33.894 |
| Average | 0.554 | 0.828 | 32.129 | 32.144 |

In additional to fiber delay lines, OEOs may also use various optical resonators as the optical delay elements 151 and 152 shown in FIG. 1 to reduce the acceleration sensitivity of the OEO. Hence, an acceleration-induced frequency shift in one resonator can be partially or completely canceled by the acceleration-induced frequency shift in another resonator. Each optical resonator may be implemented in a number of configurations, including, e.g., a Fabry-Perot resonator which may, e.g., formed from adding reflective facets at two ends of a fiber segment, a resonator formed of a fiber ring with one or two fiber couplers for input and output, and a micro resonator operating in whispering-gallery modes (e.g., a microsphere or microdisk resonators). These and other optical resonator configurations can achieve unique advantages compared to non-resonator optical delay mechanism. See, U.S. application Ser. No. 09/491,988 by Yao et. al filed Jan. 26, 2000, which is incorporated herein by reference.

Figure 4A:
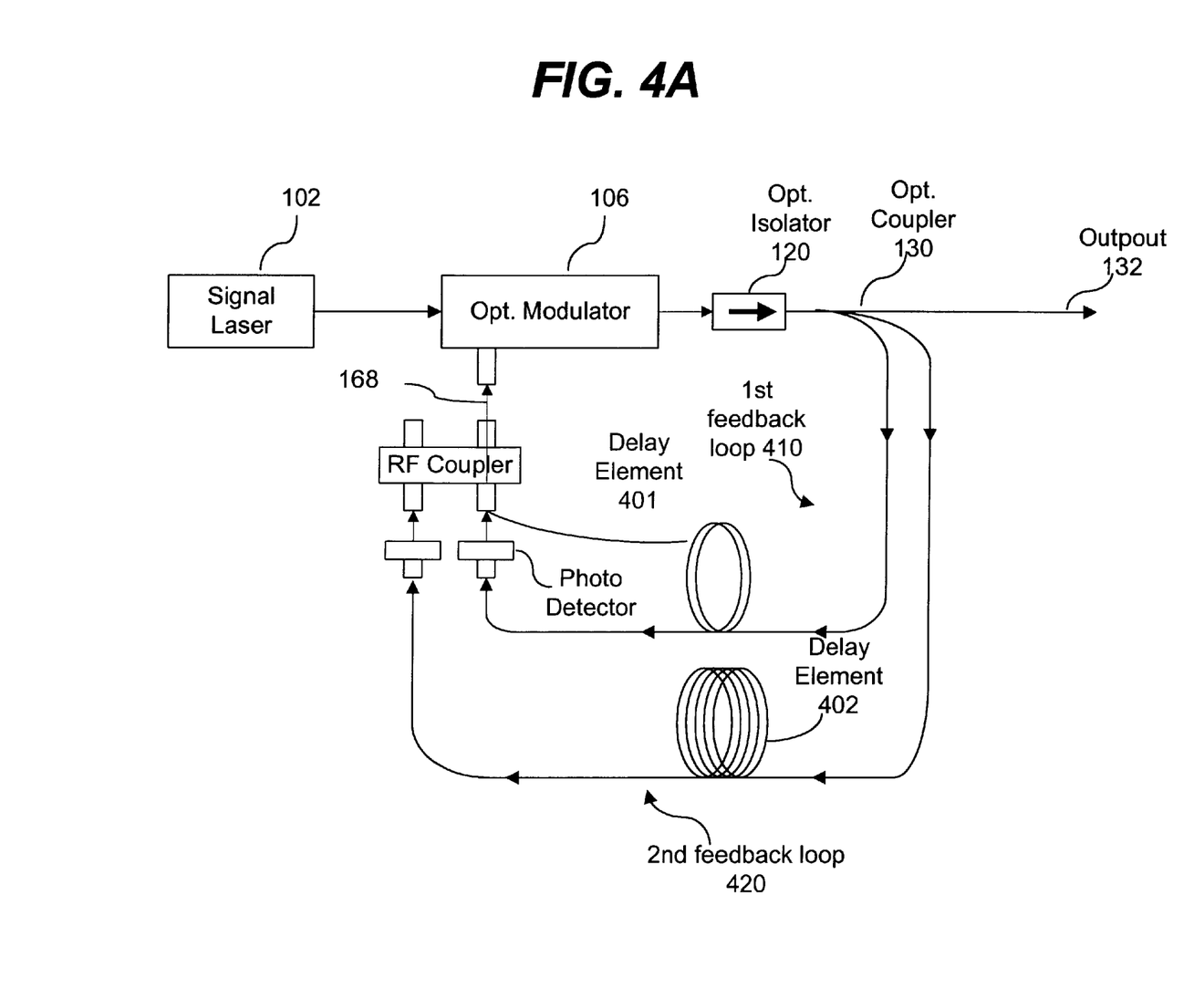
FIGS. 4A, 4B, and 4C show examples of OEOs that can be made insensitive to acceleration based on the design in FIG. 1.
Figure 4B:
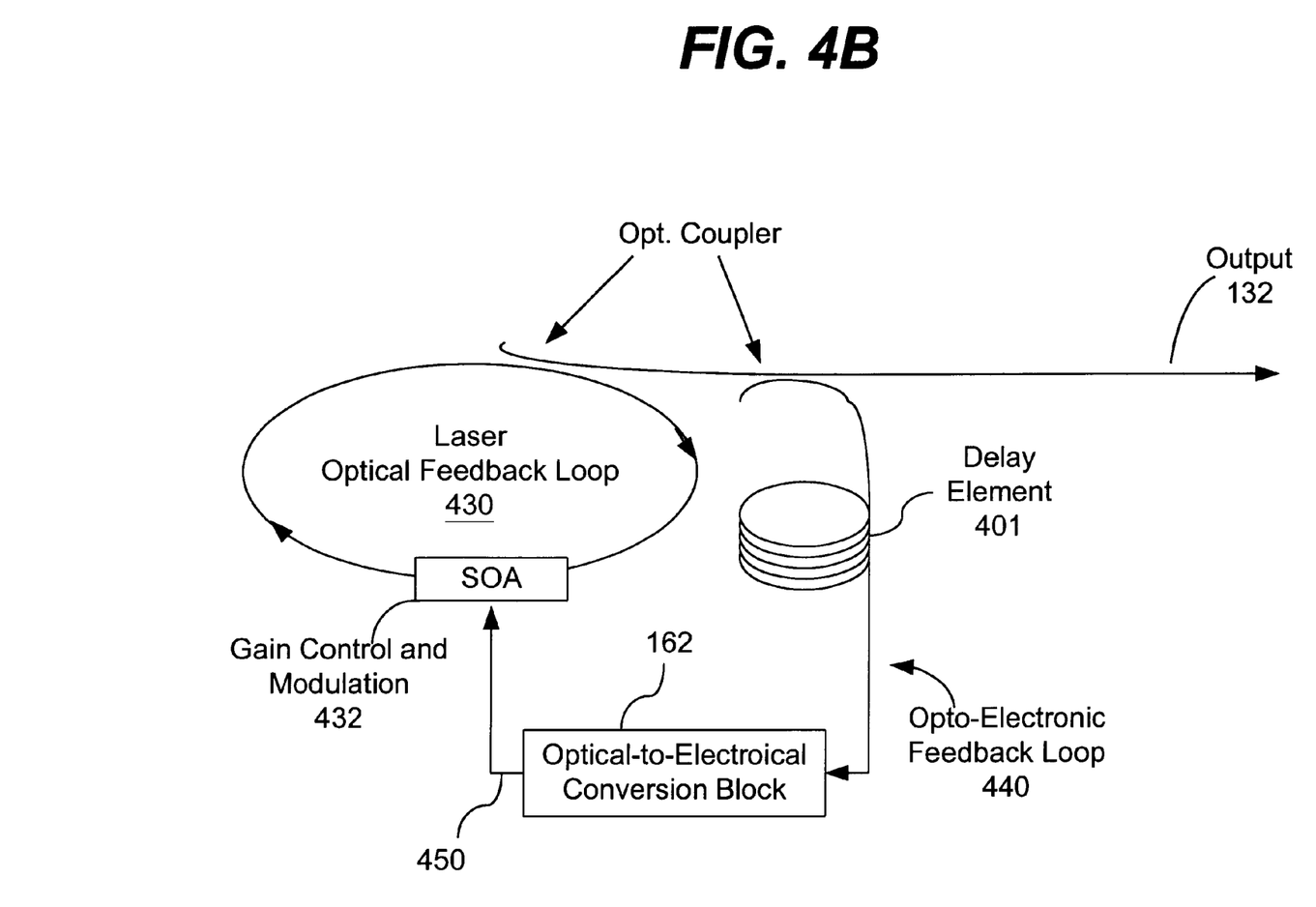
Figure 4C:
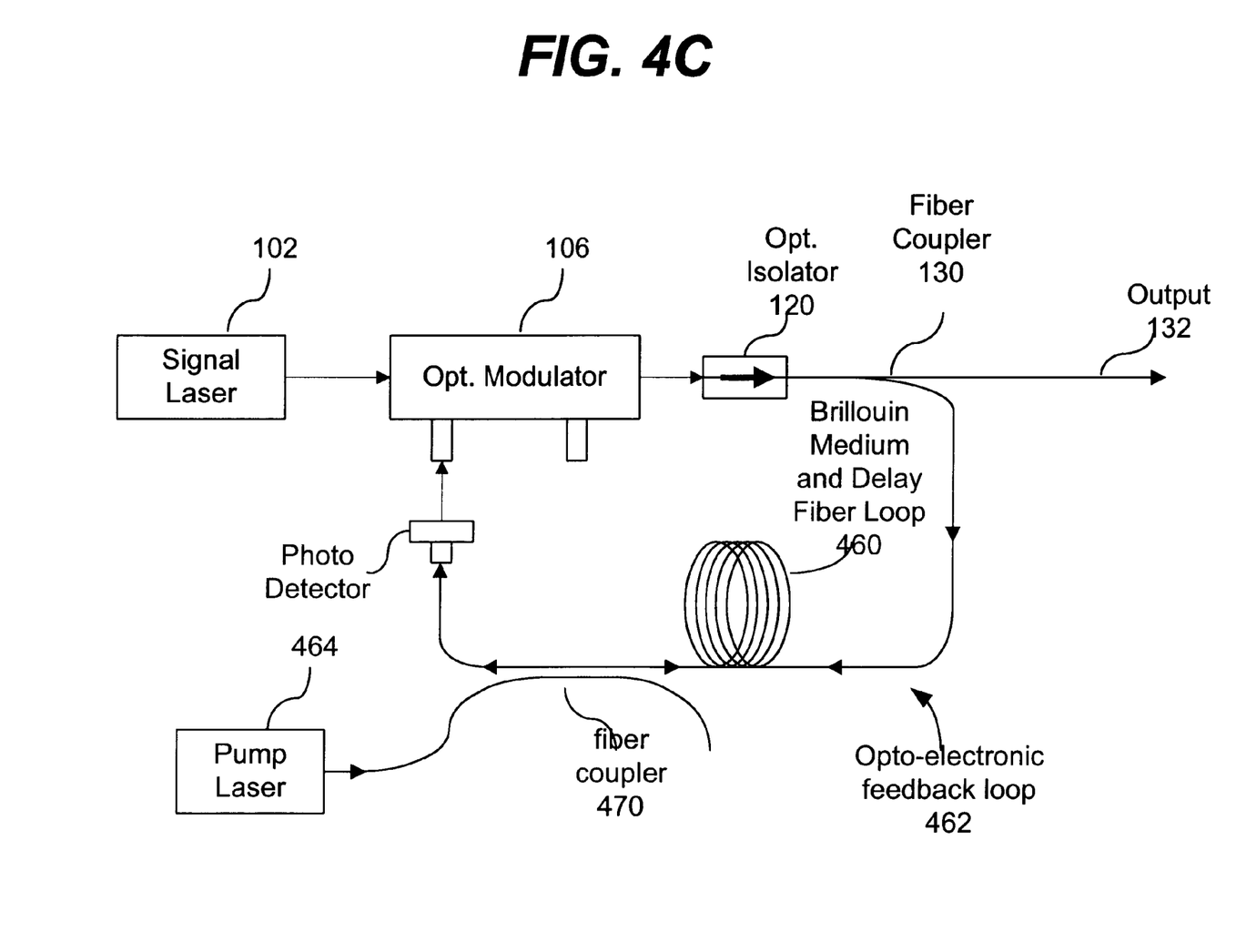

The above acceleration-insensitive OEO design may also be applied to other OEOs. FIGS. 4A, 4B, and 4C show OEOs in three configurations different from the OEOs in FIGS. 1–2. FIG. 4A shows a dual-loop OEO in which an optical delay element 401 or 402 such as a fiber loop or an optical resonator is included in each opto-electronic feedback loop 410 or 420. Alternatively, one of the feedback loops may be replaced with an electrical feedback loop. Each delay element 401 or 402 is configured to include at least two separate but optically connected delay elements 152 and 151 shown in FIG. 1.

FIG. 4B shows a coupled OEO which directly couples a laser oscillation in an optical feedback loop 430 to an electrical oscillation in an opto-electronic feedback loop 440 which includes an optical portion with an optical delay element 142 as in FIG. 1 and an electrical portion that includes an optical-to-electrical conversion block 162 (e.g., a photodetector). The optical gain of the optical feedback loop 430 is controllable by an electrical signal 450 from the opto-electronic loop 440, e.g., a semiconductor optical amplifier (SOA) 432 may be disposed in the optical loop 430. Here, the optical feedback loop 430 and the SOA 432 function as the signal laser 102 and the optical modulator 106 in FIG. 1.

In addition, opto-electronic oscillators can also be implemented by having at least one active opto-electronic feedback loop that generates an electrical modulation signal based on the stimulated Brillouin scattering. FIG. 4C shows such a Brillouin OEO which includes a Brillouin optical medium 460 in an opto-electronic feedback loop 462 and uses the natural narrow linewidth of the Brillouin scattering to select a single oscillating mode. A pump laser 464 is used to generate a Brillouin pump beam which is coupled by a coupler into the Brillouin medium 460. Similarly, the medium 460 is partitioned into two separate parts 151 and 152 as shown in FIG. 1 to reduce the overall acceleration sensitivity.

Only a few embodiments are disclosed. However, it is understood that variations and enhancements may be made without departing from the spirit of and are intended to be encompassed by the following claims.

What is claimed is:

1. A device, comprising:
   an optical modulator operable to receive and modulate a signal beam to produce modulation signals in said signal beam in response to a modulation control signal; and
   a feedback loop having an optical portion that receives a portion of said signal beam output from said optical modulator, an optical delay module in said optical portion, and an optical-to-electrical converter converting said portion into an output signal, wherein said feedback loop produces said modulation control signal from said output signal, and wherein said optical delay module includes a first optical delay element responsive to an acceleration of the device to cause a first frequency shift in said modulation control signal and a second optical delay element optically connected to said first optical delay element and responsive to said acceleration to cause a second frequency shift in said modulation control signal that is opposite to said first frequency shift.

2. The device as in claim 1, wherein one of said first and said second optical delay elements is an optical resonator.

3. The device as in claim 2, wherein said optical resonator includes a fiber resonator.

4. The device as in claim 2, wherein said optical resonator is operable in a whispering-gallery mode.

5. The device as in claim 1, wherein one of said first and said second optical delay elements is a fiber delay line.

6. The device as in claim 1, further comprising a second feedback loop having an optical portion that receives a portion of said signal beam output, a second optical delay module in said optical portion, and a second optical-to-electrical converter converting said portion into a second output signal, wherein said second feedback loop is coupled to said feedback loop to produce said modulation control signal by combining said second output signal and said output signal.

7. The device as in claim 1, wherein at least one of said first and said optical delay elements includes a Brillouin optical medium, and further comprising:
   a pump laser operable to produce a pump laser beam, and
   a coupler engaged to couple said pump laser beam into said Brillouin optical medium to produce a Brillouin optical signal.

8. A method, comprising:
   providing an opto-electronic feedback loop that has an optical portion, an electrical portion, and an optical-to-electrical converter interconnecting the optical and electrical portion, wherein the opto-electronic feedback loop is coupled to an optical modulator to form a closed loop which is operable to produce a signal oscillation at an oscillating frequency;
   designing the optical portion to have at least a first optical delay element and a second optical delay element that are optically connected to each other in series so that the total optical delay is a sum of delays in the first and the second optical delay elements; and
   mechanically engaging and optically coupling the first and second optical elements to experience a common acceleration and to produce frequency shifts in opposite directions in the oscillating frequency to reduce a dependence of the oscillating frequency on the common acceleration.

9. The method as in claim 8, wherein one of the first and said second optical delay elements is an optical resonator.

10. The method as in claim 8, wherein one of the first and said second optical delay elements includes a fiber delay line.

11. The method as in claim 8, further comprising:
    coupling a second feedback loop, which is similarly constructed as the opto-electronic feedback loop, to the optical modulator; and
    combining output signals from the opto-electronic feedback loops to produce a control signal that controls the optical modulator.

12. A device, comprising:
    an optical modulator operable to receive and modulate a signal beam to produce modulation signals in said signal beam in response to a modulation control signal; and
    a feedback loop having an optical portion that receives a portion of said signal beam output from said optical modulator, an optical delay module in said optical portion, and an optical-to-electrical converter converting said portion into an output signal, wherein said feedback loop produces said modulation control signal from said output signal, and
    wherein said optical delay module includes a first fiber coil as a first optical delay element formed on a first spool along a first axis, and a second fiber coil as a second optical delay element formed on a second spool along a second axis, said first and said second fiber coils being optically connected to said first fiber coil in series and mechanically fixed relative to each other to have said first and said second axes be substantially parallel to respond to an acceleration of the device to cause a first frequency shift in said modulation control signal and a second, opposite frequency shift in said modulation control signal, respectively.

13. The device as in claim 12, wherein said first and said second fiber coils have substantially the same fiber length.

14. The device as in claim 12, further comprising a fixture have two opposing surfaces to which said first and said second fiber coils are mechanically fixed, respectively, with said first and said second axes substantially perpendicular to said opposing surfaces.

15. The device as in claim 12, further comprising:
    a pump laser to produce a pump laser beam, and
    a pump coupler engaged to couple said pump laser beam into said first and said second fiber coils to produce a Brillouin optical signal.

16. The device as in claim 12, further comprising a second feedback loop having an optical portion that receives a portion of said signal beam output from said optical modulator, a second optical delay module in said optical portion, and a second optical-to-electrical converter converting said portion into a second output signal, wherein said second feedback loop is coupled to said feedback loop to produce said modulation control signal by combining said second output signal and said output signal.

17. A device, comprising:
   a laser, having an active optical feedback loop with a first loop gain which supports laser oscillation to produce a laser output and which changes in response to a modulation control signal; and
   an opto-electronic feedback loop coupled to said active optical feedback loop to produce said modulation control signal in response to said laser output,
   wherein said opto-electronic feedback loop comprises an optical portion that receives a portion of said laser output, an optical delay module in said optical portion, and an optical-to-electrical converter converting said portion into an output signal, wherein said feedback loop produces said modulation control signal from said output signal, and
   wherein said optical delay module includes a first optical delay element responsive to an acceleration of the device to cause a first frequency shift in said modulation control signal and a second optical delay element optically connected to said first optical delay element and responsive to said acceleration to cause a second frequency shift in said modulation control signal that is opposite to said first frequency shift.

18. The device as in claim 17, wherein one of said first and said second optical delay elements includes an optical resonator.

19. The device as in claim 18, wherein said optical resonator includes a fiber resonator.

20. The device as in claim 18, wherein said optical resonator is operable in a whispering-gallery mode.

21. The device as in claim 17, wherein one of said first and said second optical delay elements is a fiber delay line.

22. The device as in claim 17, wherein at least one of said first and said optical delay elements includes a Brillouin optical medium, and further comprising:
   a pump laser operable to produce a pump laser beam, and
   a coupler engaged to couple said pump laser beam into said Brillouin optical medium to produce a Brillouin optical signal.

23. The device as in claim 17, further comprising a second opto-electronic feedback loop having an optical portion that receives a portion of said laser output, a second optical delay module in said optical portion, and a second optical-to-electrical converter converting said portion into a second output signal, wherein said second opto-electronic feedback loop is coupled to said opto-electronic feedback loop to produce said modulation control signal by combining said second output signal and said output signal.

* * * * *